US009799725B2

(12) United States Patent
Udrea et al.

(10) Patent No.: US 9,799,725 B2
(45) Date of Patent: Oct. 24, 2017

(54) IGBT HAVING A DEEP SUPERJUNCTION STRUCTURE

(71) Applicant: Infineon Technologies Americas Corp., El Segundo, CA (US)

(72) Inventors: Florin Udrea, Cambridge (GB); Alice Pei-Shan Hsieh, Cambridge (GB); Gianluca Camuso, Cambridge (GB); Chiu Ng, El Segundo, CA (US); Yi Tang, Torrance, CA (US); Rajeev Krishna Vytla, Los Angeles, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/986,290

(22) Filed: Dec. 31, 2015

(65) Prior Publication Data

US 2016/0260825 A1    Sep. 8, 2016

Related U.S. Application Data

(60) Provisional application No. 62/128,922, filed on Mar. 5, 2015.

(51) Int. Cl.
*H01L 29/66*    (2006.01)
*H01L 29/06*    (2006.01)
(Continued)

(52) U.S. Cl.
CPC ...... *H01L 29/0634* (2013.01); *H01L 29/0696* (2013.01); *H01L 29/7397* (2013.01); *H01L 29/1095* (2013.01)

(58) Field of Classification Search
CPC .................. H01L 29/41708; H01L 29/7394
(Continued)

(56) References Cited

U.S. PATENT DOCUMENTS 8,248,116 B2    8/2012    Soeno et al.
8,304,814 B2    11/2012   Bauer
(Continued)

OTHER PUBLICATIONS

M. Antoniou, F. Udrea and F. Bauer, "Optimization of Super Junction Bipolar Transistor for Ultra-fast Switching Applications", Proc. ISPSD'2007, p. 101-104.
(Continued)

*Primary Examiner* — Chandra Chaudhari
(74) *Attorney, Agent, or Firm* — Murphy, Bilak & Homiller, PLLC (57) ABSTRACT

There are disclosed herein various implementations of an insulated-gate bipolar transistor (IGBT) having a deep superjunction structure. Such an IGBT includes a drift region having a first conductivity type situated over a collector having a second conductivity type. The IGBT also includes a gate trench extending through a base having the second conductivity type into the drift region. In addition, the IGBT includes a deep superjunction structure situated under the gate trench. The deep superjunction structure includes one or more first conductivity regions having the first conductivity type and two or more second conductivity region having the second conductivity type, the one or more first conductivity regions and the two or more second conductivity regions configured to substantially charge-balance the deep superjunction structure.

21 Claims, 6 Drawing Sheets

(51) Int. Cl.
*H01L 29/739* (2006.01)
*H01L 29/10* (2006.01)

(58) Field of Classification Search
USPC .......................... 257/142; 438/138, 206, 282
See application file for complete search history.

(56) References Cited

U.S. PATENT DOCUMENTS

| | | | |
|---|---|---|---|
| 9,024,383 B2* | 5/2015 | Gamerith | H01L 29/0619 |
| | | | 257/329 |
| 9,093,522 B1 | 7/2015 | Zeng et al. | |
| 2007/0034941 A1* | 2/2007 | Francis | H01L 29/7397 |
| | | | 257/328 |
| 2008/0135929 A1 | 6/2008 | Saito et al. | |
| 2010/0264488 A1* | 10/2010 | Hsieh | H01L 29/1095 |
| | | | 257/334 |
| 2011/0084333 A1 | 4/2011 | Disney | |
| 2011/0233684 A1 | 9/2011 | Matsushita | |
| 2012/0001199 A1 | 1/2012 | Bauer | |
| 2014/0077289 A1 | 3/2014 | Miyajima | |
| 2014/0097517 A1 | 4/2014 | Moens | |
| 2015/0115286 A1 | 4/2015 | Takeuchi et al. | |

OTHER PUBLICATIONS

M. Antoniou, F. Udrea, and F. D. Bauer, "The superjunction insulated gate bipolar transistor-Optimization and modeling," IEEE Trans. Electron Devices, vol. 57, No. 3, p. 594-600, Mar. 2010.

M. Antoniou, F. Udrea, F. D. Bauer, A. Mihaila, and I. Nistor "Towards Achieving the Soft-Punch-Through Superjunction Insulated-Gate Bipolar Transistor Breakdown Capability", IEEE Electron Device Letters, vol. 32, No. 9, Sep. 2011, p. 1275-1277.

F. Bauer, I. Nistor, A. Mihaila, M. Antoniou, and F. Udrea "Superjunction IGBT Filling the Gap Between SJ MOSFET and Ultrafast IGBT", IEEE Electron Device Letters, vol. 33, No. 9, Sep. 2012, p. 1288-1290.

* cited by examiner

IGBT HAVING A DEEP SUPERJUNCTION STRUCTURE

The present application claims the benefit of and priority to a provisional application titled "Super Junction IGBT with PNN Structure for High Frequency Applications," Ser. No. 62/128,922 filed on Mar. 5, 2015. The disclosure in this provisional application is hereby incorporated fully by reference into the present application.

BACKGROUND

Background Art

Insulated-gate bipolar transistors (IGBTs) may be implemented in a variety of applications. For instance, IGBTs may be used as power switches in motor drive inverters, as well as in direct-current (DC) to DC power converters. In these and other power applications, turn-off losses ($E_{OFF}$) and on-state voltage drop ($V_{ON}$) are typically key operating parameters, so that IGBTs having low $V_{ON}$ and substantially minimized $E_{OFF}$ during fast switching are highly desirable.

However, as switching speed increases, switching losses, including $E_{OFF}$, typically represent a significant portion of total power loss by an IGBT. Moreover, conventional techniques for minimizing $E_{OFF}$ during fast switching can have undesirable consequences for the on-state characteristics of the IGBT, such as $V_{ON}$.

SUMMARY

The present disclosure is directed to an insulated-gate bipolar transistor (IGBT) having a deep superjunction structure, substantially as shown in and/or described in connection with at least one of the figures, and as set forth in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
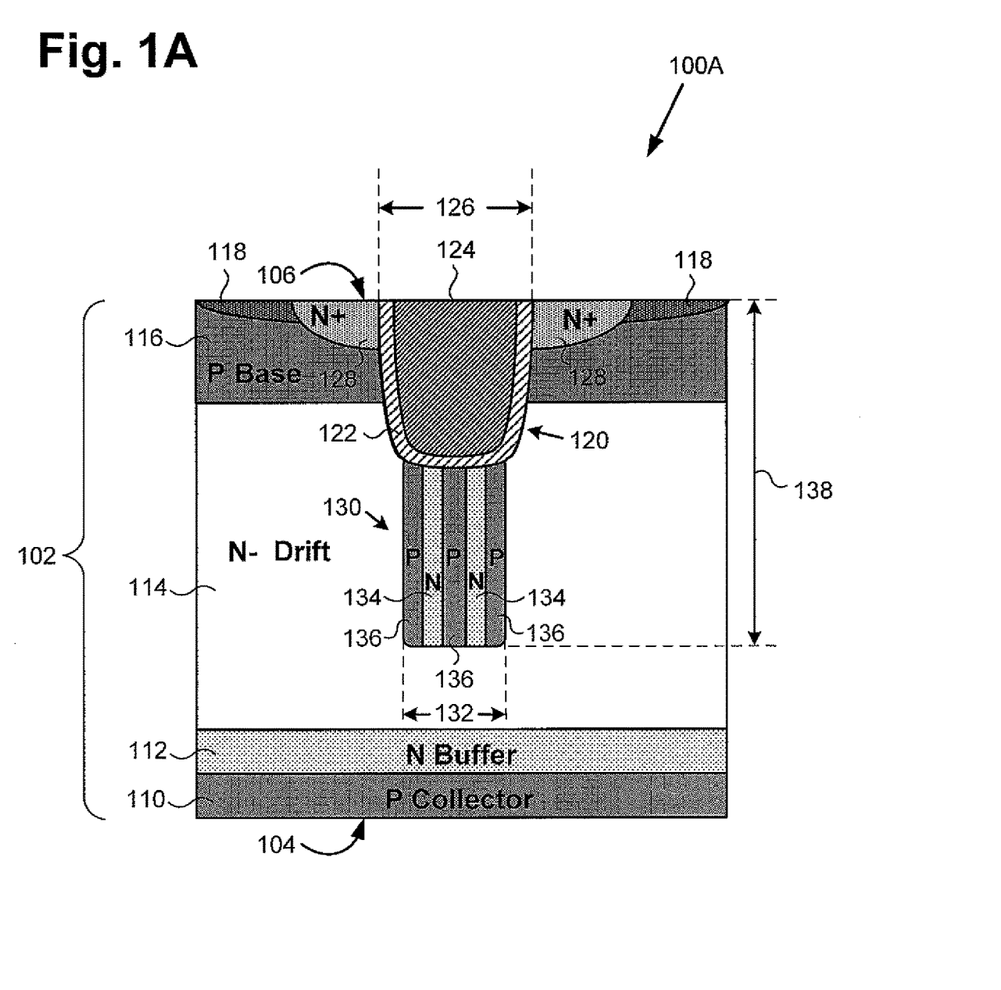
FIG. 1A presents a cross-sectional view showing a portion of an exemplary insulated gate bipolar transistor (IGBT) having a deep superjunction structure, according to one implementation.

FIG. 1A presents a cross-sectional view showing a portion of exemplary insulated-gate bipolar transistor (IGBT) 100A having a deep superjunction structure, according to one implementation. As shown in FIG. 1A, IGBT 100A is implemented as a vertical power device including P type collector 110 at bottom surface 104 of semiconductor substrate 102, and N type drift region 114 situated over P type collector 110. In addition, P type base 116 is situated over N type drift region 114. As further shown in FIG. 1A, IGBT 100A includes N type buffer or field stop layer 112 (hereinafter "buffer layer 112"), as well as N type emitter diffusions 128 and P type contacts 118 formed in P type base 116.

IGBT 100A also includes gate trench 120 extending from top surface 106 of semiconductor substrate 102, through P type base 116, and into N type drift region 114. As further shown in FIG. 1A, gate trench 120 has width 126, is bordered by N type emitter diffusions 128, and includes gate insulator 122 and gate electrode 124. In addition, IGBT 100A includes deep superjunction structure 130 having width 132 and situated under gate trench 120 to a depth 138 below top surface 106 of semiconductor substrate 102. As shown in FIG. 1A, deep superjunction structure 130 includes one or more N type regions 134 and two or more P type regions 136. One or more N type regions 134 and two or more P type regions 136 are configured to substantially charge-balance deep superjunction structure 130.

It is noted that, in operation, IGBT 100A is configured to produce a conduction channel through P type base 116 in regions beneath N type emitter diffusions 128 and immediately adjacent gate trench 120. Thus, when IGBT 100A is turned on, conduction channels (not shown as such in FIG. 1A) are produced as N type conduction channels through P type base 116 so as to enable transfer of charge carriers between N type emitter diffusions 128 and P type collector 110.

It is further noted that although the implementation shown in FIG. 1A depicts IGBT 100A as having P type collector 110, N type buffer layer 112, N type drift region 114, P type base 116, N type emitter diffusions 128, and as being configured to produce N type conduction channels, that representation is merely exemplary. In other implementations, the described polarities can be reversed. That is to say, IGBT 100A may have an N type layer corresponding to P type collector 110, a P type buffer layer, a P type drift region, an N type base, P type diffusions corresponding to N type emitter diffusions 128, and may be configured to produce a P type conduction channel adjacent gate trench 120.

Semiconductor substrate 102 may be a silicon (Si) substrate or a silicon carbide (SiC) substrate, for example. In some implementations, semiconductor substrate 102 may include N type drift region 114 and P type base 116 formed in an epitaxial silicon layer of semiconductor substrate 102. Formation of such an epitaxial silicon layer may be performed by any suitable method, as known in the art, such as chemical vapor deposition (CVD) or molecular beam epitaxy (MBE), for example. More generally, however, N type drift region 114 and P type base 116 may be formed in any suitable elemental or compound semiconductor layer included in semiconductor substrate 102.

Thus, in other implementations, N type drift region 114 and P type base 116 need not be formed through epitaxial growth, and/or need not be formed of silicon. For example, in one alternative implementation, N type drift region 114 and P type base 116 can be formed in a float zone silicon layer of semiconductor substrate 102. In other implementations, N type drift region 114 and P type base 116 can be formed in either a strained or untrained germanium layer formed as part of semiconductor substrate 102. Moreover, in some implementations, semiconductor substrate 102 may include additional layers, such as N type buffer layer 112 situated between P type collector 110 and N type drift region 114, as shown in FIG. 1A.

P type base 116 may be formed by implantation and thermal diffusion. For example, boron (B) dopants may be implanted into semiconductor substrate 102 and diffused to form P type base 116. Moreover, P type contacts 118 of P type base 116 may be more highly doped regions of P type base 116 utilizing the same dopant species used to form P type base 116.

Gate insulator 122 may be formed using any material and any technique typically employed in the art. For example, gate insulator 122 may be formed of silicon oxide, and may be deposited or thermally grown to line gate trench 120. Gate electrode 124 may also be formed using any material typically utilized in the art. For example, gate electrode 124 may be formed of doped polysilicon or metal.

As shown in FIG. 1A, gate trench 120 is bordered by N type emitter diffusions 128. N type emitter diffusions 128 may be selectively formed in P type base 116 using any conventional techniques known in the art. For example, phosphorus (P) or arsenic (As) dopants may be implanted into P type base 116 and diffused to form N type emitter diffusions 128. Although not explicitly shown in FIG. 1A, N type emitter diffusions 128 can be electrically connected to one another in the third dimension relative to the cross-sectional perspective shown by FIG. 1A.

As noted above, deep superjunction structure 130 includes at least one N type region 134 and at least two P type regions 136. It is further noted that, as shown in FIG. 1A, N type region or regions 134 may take the form of N type conductive pillar(s) situated under gate trench 120 and extending toward collector 110 (hereinafter "N type conductive pillar(s) 134"). In addition, and as also shown in FIG. 1A, P type regions 136 may take the form of P type conductive pillars situated under gate trench 120 and extending toward collector 110 (hereinafter "P type conductive pillars 136"). Moreover, in some implementations, deep superjunction structure 130 may include multiple N type conductive pillars 134 as well as multiple P type conductive pillars 136. However, in all implementations, the number of P type conductive pillars 136 exceeds the number of N type conductive pillar(s) 134.

In one implementation, for example, deep superjunction structure 130 may include two P type conductive pillars 136 and one N type conductive pillar 134 situated between and adjoining the two P type conductive pillars 136. In another exemplary implementation, deep superjunction structure 130 may include multiple N type conductive pillars 134 and multiple P type conductive pillars 136, where each N type conductive pillar 134 is situated between two P type conductive pillars 136.

N type conductive pillar(s) 134 and P type conductive pillars 136 of deep superjunction structure 130 may have a doping concentration greater than that of N type drift region 114 and less than that of N type emitter diffusions 128. In one implementation, N type conductive pillar(s) 134 and P type conductive pillars 136 may have a doping concentration substantially equal to that of N type buffer layer 112. For example, N type conductive pillar(s) 134 and P type conductive pillars 136 may have a doping concentration of from approximately $1\times10^{15}/cm^3$ to approximately $1\times10^{16}/cm^3$, while the doping concentration of N type drift region 114 is typically from approximately $1\times10^{13}/cm^3$ to approximately $2\times10^{14}/cm^3$.

According to the implementation shown in FIG. 1A, deep superjunction structure 130 has width 132 less than or substantially equal to width 126 of gate trench 120. Moreover, according to the present implementation, deep superjunction structure 130 terminates in N type drift region 114 at depth 138, which is above N type buffer layer 112. In other words, in some implementations, deep superjunction structure 130 is spaced apart from N type buffer layer 112 by N type drift region 114.

Figure 1B:
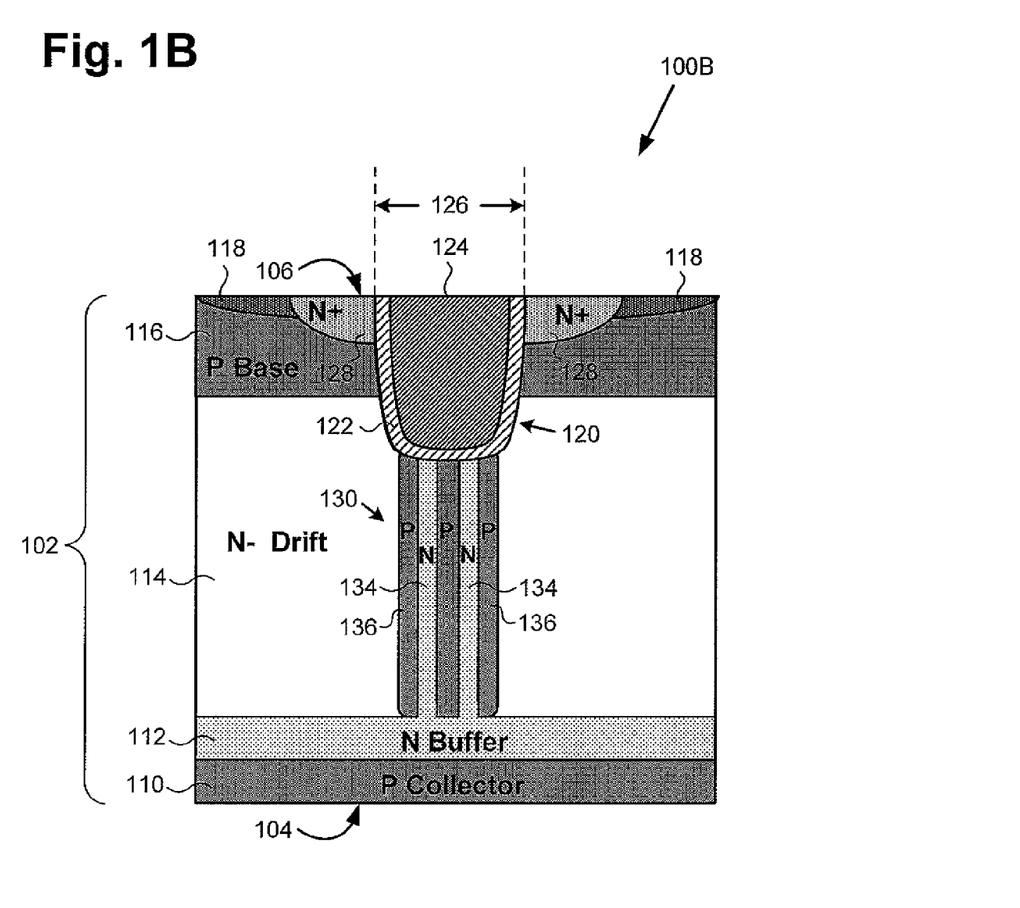
FIG. 1B presents a cross-sectional view showing a portion of an exemplary IGBT having a deep superjunction structure, according to another implementation.

Referring to FIG. 1B, FIG. 1B presents a cross-sectional view showing a portion of exemplary IGBT 100B having a deep superjunction structure, according to another implementation. It is noted that features identified by reference numbers previously shown and described in relation to FIG. 1A, above, correspond respectively to those previously discussed features and may share any of the characteristics attributed to those features in the present application.

In contrast to the implementation shown by FIG. 1A, however, in which deep superjunction structure 130 extends to depth 138 within N type drift region 114, according to the implementation in FIG. 1B, deep superjunction structure 130 extends to N type buffer layer 112. That is to say, according to the implementation shown in FIG. 1B, deep superjunction structure 130 extends through N type drift region 114 so as to adjoin N type buffer layer 112. As a result, in implementations in which deep superjunction structure 130 adjoins N type buffer layer 112, P type conductive pillars 136 are adjoined by N type drift region 114. Thus, in implementations in which deep superjunction structure 130 adjoins N type buffer layer 112, deep superjunction structure 130 can form multiple PN junctions with N type drift region 114.

As noted above, N type conductive pillar(s) 134 and P type conductive pillars 136 are configured to substantially charge-balance deep superjunction structure 130. That substantial charge-balance of deep superjunction structure 130 is achieved when the surface doping density of N type conductive pillar(s) 134, which equals the doping density of N type conductive pillar(s) 134 multiplied by the area of N conductive pillar(s) 134 (i.e., width×depth) is substantially equal to the surface doping density of P type conductive pillars 136, which is analogously calculated. During turn-off of IGBT 100A/100B, the depletion region extends rapidly from the top of N type drift region 114 to N type buffer layer 112 due to the two-dimensional fast depletion of N type conductive pillar(s) 134 and P type conductive pillars 136, which also enables fast extraction of deep charge carriers.

As a result, the delay time and turn-off time of IGBT 100A/100B can be reduced, while the voltage blocking in the off-state is facilitated by the presence of deep superjunction structure 130. During turn-off, charge-balanced deep superjunction structure 130 assists in the removal of charge carriers from N type drift region 114, which is conductivity modulated, thereby significantly enhancing the switching speed and turn-off performance of IGBT 100A/100B. In other words, charge-balanced deep superjunction structure 130 enables IGBT 100A/100B to have lower turn-off losses ($E_{OFF}$), shorter delay time ($T_d$), and shorter turn-off time ($T_f$), when compared to conventional IGBTs. Moreover, the above advantages may be achieved while maintaining the on-state voltage drop ($V_{ON}$) of IGBT 100A/100B at a desirably low level.

Figure 2A:
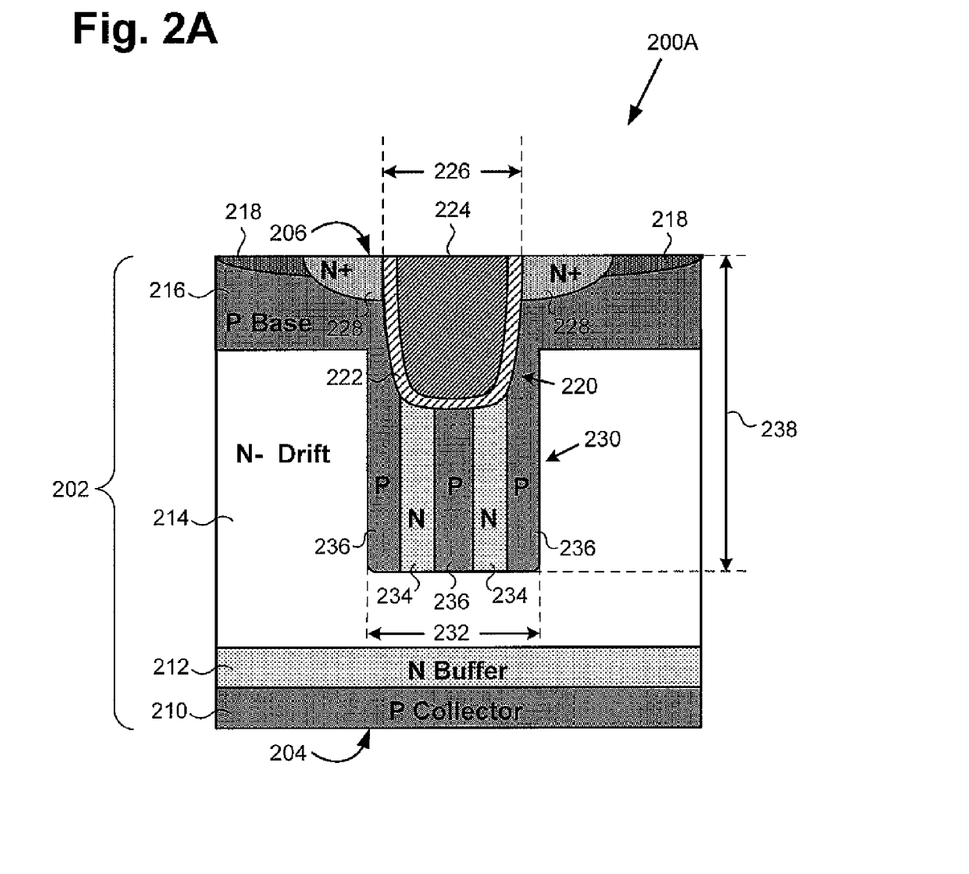
FIG. 2A presents a cross-sectional view showing a portion of an exemplary IGBT having a deep superjunction structure, according to still another implementation.

Continuing to FIG. 2A, FIG. 2A presents a cross-sectional view showing a portion of exemplary IGBT 200A having a deep superjunction structure, according to another implementation. As shown in FIG. 2A, IGBT 200A is implemented as a vertical power device including P type collector 210 at bottom surface 204 of semiconductor substrate 202, and N type drift region 214 situated over P type collector 210. In addition, P type base 216 is situated over N type drift region 214. As further shown in FIG. 2A, IGBT 200A includes N type buffer layer 212, as well as N type emitter diffusions 228 and P type contacts 218 formed in P type base 216.

IGBT 200A also includes gate trench 220 extending from top surface 206 of semiconductor substrate 202, through P type base 216, and into N type drift region 214. As further shown in FIG. 2A, gate trench 220 has width 226, is bordered by N type emitter diffusions 228, and includes gate insulator 222 and gate electrode 224. In addition, IGBT 200A includes deep superjunction structure 230 having width 232 and situated under gate trench 220 to a depth 238 below top surface 206 of semiconductor substrate 202. As shown in FIG. 2A, deep superjunction structure 230 includes one or more N type regions 234 and two or more P type regions 236. One or more N type regions 234 and two or more P type regions 236 may be implemented as conductive pillars (hereinafter "N type conductive pillar(s) 234" and "P type conductive pillars 236", respectively) extending toward collector 210. N type conductive pillar(s) 234 and P type conductive pillars 236 are configured to substantially charge-balance deep superjunction structure 230.

IGBT 200A corresponds in general to IGBT 100A, in FIG. 1A. That is to say, semiconductor substrate 202, P type collector 210, N type buffer layer 212, and N type drift region 214, in FIG. 2A, correspond respectively in general to semiconductor substrate 102, P type collector 110, N type buffer layer 112, and N type drift region 114, in FIG. 1A, and may share any of the characteristics attributed to those corresponding features, above.

In addition, P type base 216, P type contacts 218, and N type emitter diffusions 228, in FIG. 2A, correspond respectively in general to P type base 116, P type contacts 118, and N type emitter diffusions 128, in FIG. 1A and may share any of the characteristics attributed to those corresponding features, above. Moreover, depth 238, and gate trench 220 having width 226 and including gate insulator 222 and gate electrode 224, in FIG. 2A, correspond respectively in general to depth 138, and gate trench 120 having width 126 and including gate insulator 122 and gate electrode 124, in FIG. 1A, and may share any of the characteristics attributed to those corresponding features, above.

As shown in FIG. 2A, deep superjunction structure 230 includes at least one N type conductive pillar 234 and at least two P type conductive pillars 236. Moreover, and as further shown in FIG. 2A, in some implementations, deep superjunction structure 230 may include multiple N type conductive pillars 234 and multiple P type conductive pillars 236. However, in all implementations, the number of P type conductive pillars 236 exceeds the number of N type conductive pillar(s) 234.

In one implementation, for example, deep superjunction structure 230 may include two P type conductive pillars 236 and one N type conductive pillar 234 situated between and adjoining the two P type conductive pillars 236. In another exemplary implementation, deep superjunction structure 230 may include multiple N type conductive pillars 234 and multiple P type conductive pillars 236, where each N type conductive pillar 234 is situated between two P type conductive pillars 236.

N type conductive pillar(s) 234 and P type conductive pillars 236 of deep superjunction structure 230 may have a doping concentration greater than that of N type drift region 214 and less than that of N type emitter diffusions 228. In one implementation, N type conductive pillar(s) 234 and P type conductive pillars 236 may have a doping concentration substantially equal to that of N type buffer layer 212. For example, N type conductive pillar(s) 234 and P type conductive pillars 236 may have a doping concentration of from approximately $1\times10^{15}/cm^3$ to approximately $1\times10^{16}/cm^3$.

According to the implementation shown in FIG. 2A, deep superjunction structure 230 has width 232 greater than width 226 of gate trench 220. Moreover, according to the present implementation, deep superjunction structure 230 terminates in N type drift region 214 at depth 238, which is above N type buffer layer 212. In other words, in some implementations, deep superjunction structure 230 is spaced apart from N type buffer layer 212 by N type drift region 214. In addition, and as further shown in FIG. 2A, in some implementations, deep superjunction structure 230 surrounds a portion of gate trench 220 so as to adjoin P type base 216.

Figure 2B:
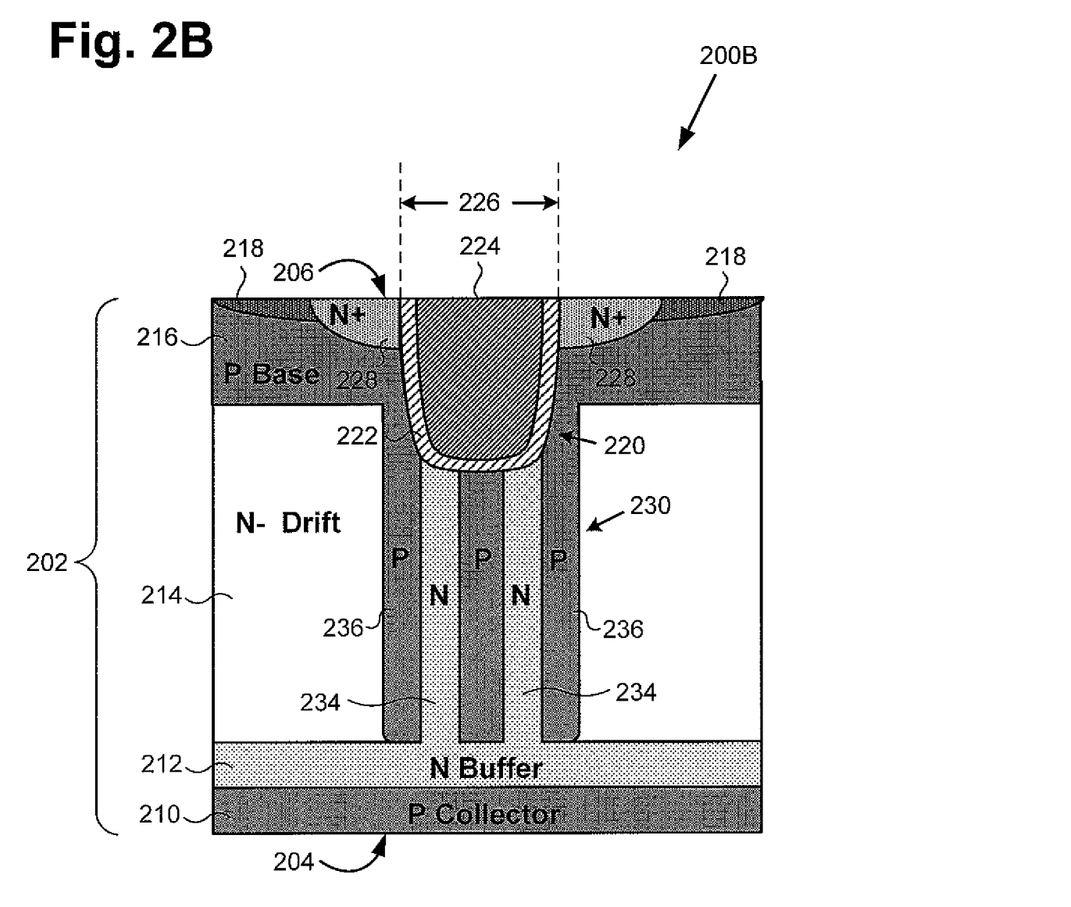
FIG. 2B presents a cross-sectional view showing a portion of an exemplary IGBT having a deep superjunction structure, according to yet another implementation.

Referring to FIG. 2B, FIG. 2B presents a cross-sectional view showing a portion of exemplary IGBT 200B having a deep superjunction structure, according to yet another implementation. It is noted that features identified by reference numbers previously shown and described in relation to FIG. 2A, above, correspond respectively to those previously discussed features and may share any of the characteristics attributed to those features in the present application.

In contrast to the implementation shown by FIG. 2A, however, in which deep superjunction structure 230 extends to depth 238 within N type drift region 214, according to the implementation in FIG. 2B, deep superjunction structure 230 extends to N type buffer layer 212. That is to say, according to the implementation shown in FIG. 2B, deep superjunction structure 230 extends through N type drift region 214 so as to adjoin N type buffer layer 212, while also adjoining P type base 216. As a result, in implementations in which deep superjunction structure 230 adjoins P type base 216 and N type buffer layer 212, P type conductive pillars 236 are adjoined by N type drift region 214. Thus, in implementations in which deep superjunction structure 230 adjoins P type base 216 and N type buffer layer 212, deep superjunction structure 230 can form multiple PN junctions with N type drift region 214.

N type conductive pillar(s) 234 and P type conductive pillars 236 are configured to substantially charge-balance deep superjunction structure 230. That substantial charge-balance of deep superjunction structure 230 is achieved when the surface doping density of N type conductive pillar(s) 234, which equals the doping density of N type conductive pillar(s) 234 multiplied by the area of N conductive pillar(s) 234 (i.e., width×depth) is substantially equal to the surface doping density of P type conductive pillars 236, which is analogously calculated. During turn-off of IGBT 200A/200B, the depletion region extends rapidly from the top of N type drift region 214 to N type buffer layer 212 due to the two-dimensional fast depletion of N type conductive pillar(s) 234 and P type conductive pillars 236, which also enables fast extraction of deep charge carriers.

As a result, the delay time and turn-off time of IGBT 200A/200B can be reduced, while the voltage blocking in the off-state is facilitated by the presence of deep superjunction structure 230. During turn-off, charge-balanced deep superjunction structure 230 assists in the removal of charge carriers from N type drift region 214, which is conductivity modulated, thereby significantly enhancing the switching speed and turn-off performance of IGBT 200A/200B. In other words, charge-balanced deep superjunction structure 230 enables IGBT 200A/200B to have lower $E_{OFF}$, shorter $T_d$, and shorter $T_f$, when compared to conventional IGBTs. Moreover, the above advantages may be achieved while maintaining the $V_{ON}$ of IGBT 200A/200B at a desirably low level.

Figure 3A:
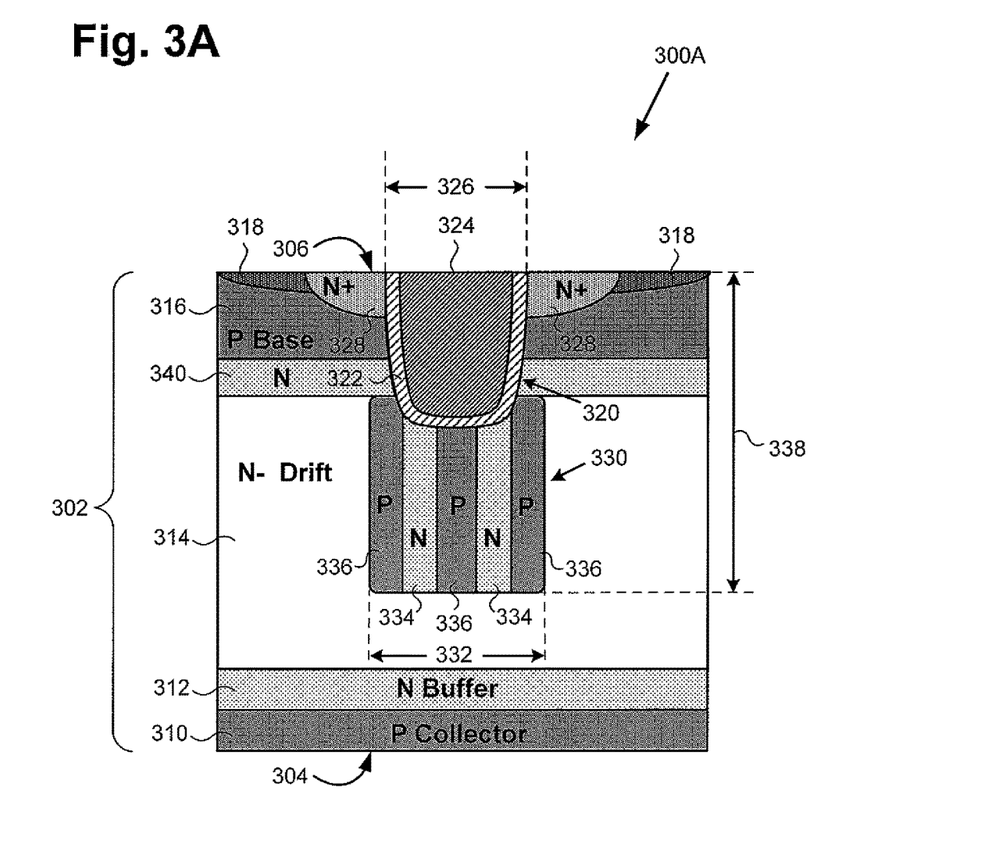
FIG. 3A presents a cross-sectional view showing a portion of an exemplary IGBT having a deep superjunction structure, according to a further implementation.

Moving to FIG. 3A, FIG. 3A presents a cross-sectional view showing a portion of exemplary IGBT 300A having a deep superjunction structure, according to still another implementation. As shown in FIG. 3A, IGBT 300A is implemented as a vertical power device including P type collector 310 at bottom surface 304 of semiconductor substrate 302, and N type drift region 314 situated over P type collector 310. In addition, P type base 316 is situated over N type drift region 314. As further shown in FIG. 3A, IGBT 300A includes N type buffer layer 312, as well as N type emitter diffusions 328 and P type contacts 318 formed in P type base 316. Moreover, IGBT 300A further includes N type enhancement layer 340 situated between N type drift region 314 and P type base 316.

IGBT 300A also includes gate trench 320 extending from top surface 306 of semiconductor substrate 302, through P type base 316, through N type enhancement layer 340, and into N type drift region 314. As further shown in FIG. 3A, gate trench 320 has width 326, is bordered by N type emitter diffusions 328, and includes gate insulator 322 and gate electrode 324. In addition, IGBT 300A includes deep superjunction structure 330 having width 332 and situated under gate trench 320 to a depth 338 below top surface 306 of semiconductor substrate 302. As shown in FIG. 3A, deep superjunction structure 330 includes one or more N type regions 334 in the form of N type conductive pillar(s) (hereinafter "N type conductive pillar(s) 334") and two or more P type regions 336 in the form of P type conductive pillars (hereinafter "P type conductive pillars 336"). One or more N type conductive pillar(s) 334 and two or more P type conductive pillars 336 are configured to substantially charge-balance deep superjunction structure 330.

Semiconductor substrate 302, P type collector 310, N type buffer layer 312, and N type drift region 314, in FIG. 3A, correspond respectively in general to semiconductor substrate 102, P type collector 110, N type buffer layer 112, and N type drift region 114, in FIG. 1A, and may share any of the characteristics attributed to those corresponding features, above. In addition, P type base 316, P type contacts 318, and N type emitter diffusions 328, in FIG. 3A, correspond respectively in general to P type base 116, P type contacts 118, and N type emitter diffusions 128, in FIG. 1A and may share any of the characteristics attributed to those corresponding features, above.

Depth 338, and gate trench 320 having width 326 and including gate insulator 322 and gate electrode 324, in FIG. 3A, correspond respectively in general to depth 138, and gate trench 120 having width 126 and including gate insulator 122 and gate electrode 124, in FIG. 1A, and may share any of the characteristics attributed to those corresponding features, above. Moreover, deep superjunction structure 330 having width 332 greater than width 326 of gate trench 320, corresponds in general to deep superjunction structure 230 having width 232 greater than width 226 of gate trench 220, in FIG. 2A, and may share any of the characteristics attributed to that corresponding feature, above. In other words, one or more N type conductive pillar 334 and two or more P type conductive pillars 336 of deep superjunction structure 330 correspond in general to one or more N type conductive pillars 234 and two or more P type conductive pillars 236 of deep superjunction structure 230, and may share any of the characteristics attributed to those corresponding features, above.

According to the implementation shown in FIG. 3A, N type enhancement layer 340 is situated between N type drift region 314 and P type base 316. For example, phosphorus or arsenic dopants may be implanted into N type drift region 314 to produce N type enhancement layer 340 having a doping concentration of from approximately $1\times10^{15}/cm^3$ to approximately $1\times10^{16}/cm^3$. In addition, and as further shown in FIG. 3A, in some implementations, deep superjunction structure 330 surrounds a portion of gate trench 320 so as to adjoin N type enhancement layer 340. Moreover, according to the present implementation, deep superjunction structure 330 terminates in N type drift region 314 at depth 338, which is above N type buffer layer 312. In other words, in some implementations, deep superjunction structure 330 adjoins N type enhancement layer 340 while being spaced apart from N type buffer layer 312 by N type drift region 314.

Figure 3B:
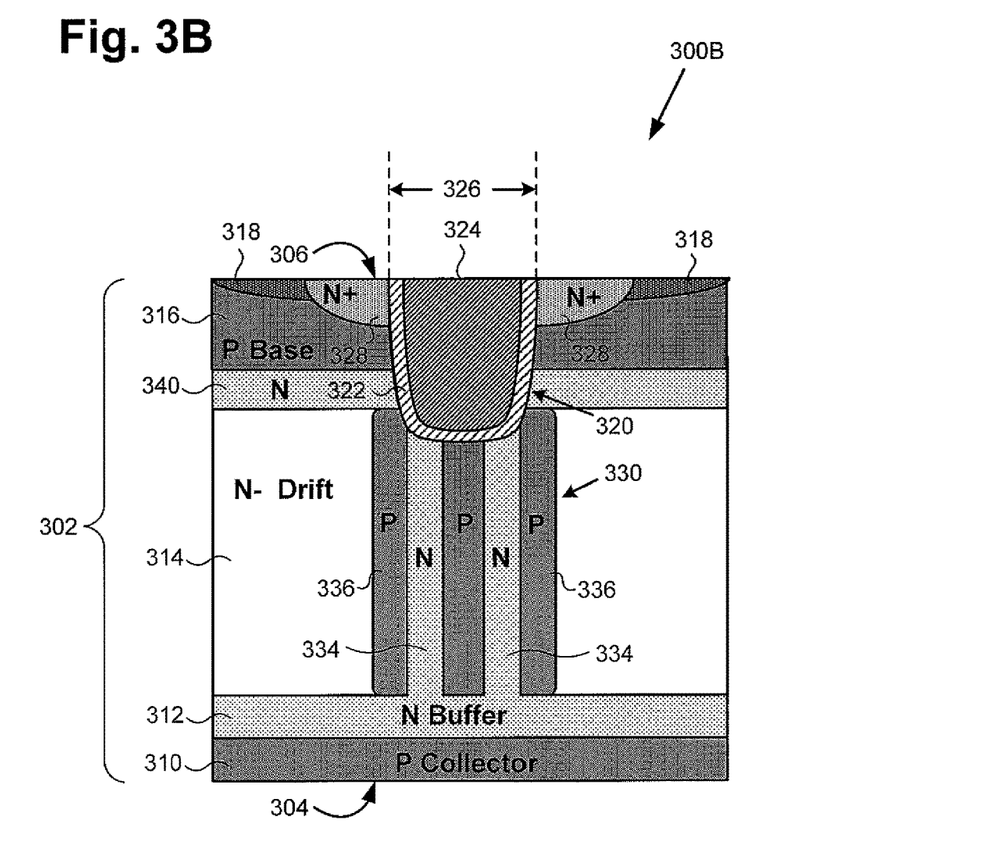
FIG. 3B presents a cross-sectional view showing a portion of an exemplary IGBT having a deep superjunction structure, according to another implementation.

Referring to FIG. 3B, FIG. 3B presents a cross-sectional view showing a portion of exemplary IGBT 300B having a deep superjunction structure, according to another implementation. It is noted that features identified by reference numbers previously shown and described in relation to FIG. 3A, above, correspond respectively to those previously discussed features and may share any of the characteristics attributed to those features in the present application.

In contrast to the implementation shown by FIG. 3A, however, in which deep superjunction structure 330 extends to depth 338 within N type drift region 314, according to the implementation in FIG. 3B, deep superjunction structure 330 extends to N type buffer layer 312. That is to say, according to the implementation shown in FIG. 3B, deep superjunction structure 330 extends through N type drift region 314 so as to adjoin N type buffer layer 312, while also adjoining N type enhancement layer 340. As a result, in implementations in which deep superjunction structure 330 adjoins N type enhancement layer 340 and N type buffer layer 312, P type conductive pillars 336 are adjoined by N type drift region 314. Thus, in implementations in which deep superjunction structure 330 adjoins N type enhancement layer 340 and N type buffer layer 312, deep superjunction structure 330 can form multiple PN junctions with N type drift region 314.

N type conductive pillar(s) 334 and P type conductive pillars 336 are configured to substantially charge-balance deep superjunction structure 330, as discussed above by reference to deep superjunction structures 130 and 230. As a result, during turn-off of IGBT 300A/300B, the depletion region extends rapidly from the top of N type drift region 314 to N type buffer layer 312 due to the two-dimensional fast depletion of N type conductive pillar(s) 334 and P type conductive pillars 336, which also enables fast extraction of deep charge carriers.

Consequently, the delay time and turn-off time of IGBT 300A/300B can be reduced, while the voltage blocking in the off-state is facilitated by the presence of deep superjunction structure 330. During turn-off, charge-balanced deep superjunction structure 330 assists in the removal of charge carriers from N type drift region 314, which is conductivity modulated, thereby significantly enhancing the switching speed and turn-off performance of IGBT 300A/300B.

Thus, the present application discloses implementations of an IGBT having a deep superjunction structure. As disclosed in the present application, incorporating such a deep superjunction structure into the IGBT enables the IGBT to have lower $E_{OFF}$, shorter $T_d$, and shorter $T_f$, when compared to conventional IGBTs. Moreover, these advantages may be achieved while maintaining the $V_{ON}$ of the IGBT at a desirably low level.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. An insulated-gate bipolar transistor (IGBT) comprising:
   a drift region having a first conductivity type situated over a collector having a second conductivity type opposite said first conductivity type;
   a gate trench extending through a base having said second conductivity type into said drift region;
   a deep superjunction structure comprising at least one first conductivity pillar having said first conductivity type and at least two second conductivity pillars having said second conductivity type situated under said gate trench, said at least one first conductivity pillar and said at least two second conductivity pillars extending in parallel from a bottom of said gate trench toward said collector;
   said at least one first conductivity pillar and said at least two second conductivity pillars configured to substantially charge balance said deep superjunction structure.

2. The IGBT of claim 1, wherein said deep superjunction structure comprises one said first conductivity pillar and two said second conductivity pillars, said first conductivity pillar situated between said two second conductivity pillars.

3. The IGBT of claim 1, wherein said deep superjunction structure comprises a first plurality of said first conductivity pillars and a second plurality of said second conductivity pillars, said second plurality being greater than said first plurality.

4. The IGBT of claim 1, wherein said deep superjunction structure comprises a first plurality of said first conductivity pillars and a second plurality of said second conductivity pillars, and wherein each of said first conductivity pillars is situated between two of said second conductivity pillars.

5. The IGBT of claim 1, wherein said deep superjunction structure has a width that is less than or substantially equal to a width of said gate trench.

6. The IGBT of claim 1, wherein said deep superjunction structure has a width that is greater than a width of said gate trench.

7. The IGBT of claim 1, wherein said deep superjunction structure adjoins said base.

8. The IGBT of claim 1, further comprising an enhancement layer having said first conductivity type situated between said drift region and said base, wherein said deep superjunction structure adjoins said enhancement layer.

9. The IGBT of claim 1, further comprising a buffer layer having said first conductivity type situated between said collector and said drift region, said deep superjunction structure being spaced apart from said buffer layer by said drift region.

10. The IGBT of claim 1, further comprising a buffer layer having said first conductivity type situated between said collector and said drift region, said deep superjunction structure adjoining said buffer layer.

11. An insulated-gate bipolar transistor (IGBT) comprising:
    a drift region having a first conductivity type situated over a collector having a second conductivity type opposite said first conductivity type;
    a gate trench extending through a base having said second conductivity type into said drift region;
    a deep superjunction structure comprising at least one conductive pillar having said first conductivity type and at least two conductive pillars having said second conductivity type situated under said gate trench and extending toward said collector;
    said at least one conductive pillar having said first conductivity type and said at least two conductive pillars having said second conductivity type configured to substantially charge balance said deep superjunction structure.

12. The IGBT of claim 11, wherein said deep superjunction structure comprises one conductive pillar having said first conductivity type and two conductive pillars having said second conductivity type, said one conductive pillar having said first conductivity type situated between said two conductive pillars having said second conductivity type.

13. The IGBT of claim 11, wherein said deep superjunction structure comprises a first plurality of conductive pillars having said first conductivity type and a second plurality of conductive pillars having said second conductivity type, and wherein said second plurality is greater than said first plurality.

14. The IGBT of claim 11, wherein said deep superjunction structure comprises a first plurality of conductive pillars having said first conductivity type and a second plurality of conductive pillars having said second conductivity type, and wherein each of said conductive pillars having said first conductivity type is situated between two of said conductive pillars having said second conductivity type.

15. The IGBT of claim 11, wherein said deep superjunction structure has a width that is less than or substantially equal to a width of said gate trench.

16. The IGBT of claim 11, wherein said deep superjunction structure has a width that is greater than a width of said gate trench.

17. The IGBT of claim 11, wherein said deep superjunction structure adjoins said base.

18. The IGBT of claim 11, further comprising an enhancement layer having said first conductivity type situated between said drift region and said base, wherein said deep superjunction structure adjoins said enhancement layer.

19. The IGBT of claim 11, further comprising a buffer layer having said first conductivity type situated between said collector and said drift region, said deep superjunction structure being spaced apart from said buffer layer by said drift region.

20. The IGBT of claim 11, further comprising a buffer layer having said first conductivity type situated between said collector and said drift region, said deep superjunction structure adjoining said buffer layer.

21. The IGBT of claim 3, wherein one of said first conductivity pillars is interposed between two of said second conductivity pillars, and an additional two of said first conductivity pillars adjoining said second conductivity pillars whereby each of said second conductivity pillars is interposed between two of said first conductivity pillars.

\* \* \* \* \*

UNITED STATES PATENT AND TRADEMARK OFFICE
CERTIFICATE OF CORRECTION

PATENT NO. : 9,799,725 B2  
APPLICATION NO. : 14/986290  
DATED : October 24, 2017  
INVENTOR(S) : F. Udrea et al.

Page 1 of 1

It is certified that error appears in the above-identified patent and that said Letters Patent is hereby corrected as shown below:

On the Title Page

Item (57)/Abstract, Line 12, please change "region having" to -- regions having --

Signed and Sealed this  
Nineteenth Day of December, 2017

Joseph Matal  
*Performing the Functions and Duties of the*  
*Under Secretary of Commerce for Intellectual Property and*  
*Director of the United States Patent and Trademark Office*